United States Patent [19]
White

[11] Patent Number: 5,121,282
[45] Date of Patent: Jun. 9, 1992

[54] ARCING FAULT DETECTOR

[76] Inventor: Orval C. White, P.O. Box 36, Spencer, Okla. 73084

[21] Appl. No.: 502,042

[22] Filed: Mar. 30, 1990

[51] Int. Cl.[5] .......................................... H02H 3/38
[52] U.S. Cl. ...................................... 361/42; 361/45; 361/49; 361/79; 361/111
[58] Field of Search ............... 361/45, 49, 42, 85-87, 361/79, 91, 111

[56] References Cited

U.S. PATENT DOCUMENTS

| | | |
|---|---|---|
| 3,764,853 | 10/1973 | Beachley, Jr. . |
| 3,852,734 | 12/1974 | Truax . |
| 3,911,323 | 10/1975 | Wilson et al. . |
| 4,079,434 | 3/1978 | Elmore .................................. 361/79 |
| 4,159,501 | 6/1979 | White . |
| 4,208,627 | 6/1980 | Ebert, Jr. . |
| 4,447,845 | 5/1984 | Wilkinson ............................ 361/80 |
| 4,532,568 | 7/1985 | Kraus, Sr. . |
| 4,536,815 | 8/1985 | Li et al. ................................ 361/47 |
| 4,542,468 | 9/1985 | Taniguti . |
| 4,617,636 | 10/1986 | Johns et al. . |
| 4,706,156 | 11/1987 | Caunce .................................. 361/65 |
| 4,851,782 | 7/1989 | Jeerings et al. ....................... 361/79 |

OTHER PUBLICATIONS

"Impact of Arcing Ground Faults on Low Voltage Power System Design", GE Catalog No. GET-6098, 4. The Behavior of Arcing Faults.

*Industrial Power Systems Data Book*, "Fundamentals of A-c Short-Circuit Currents", published by General Electric, Section .10, pp. 7-11, and Section .102, pp. 1-7.

*Primary Examiner*—Todd E. DeBoer
*Attorney, Agent, or Firm*—Eugene Stephens & Associates

[57] ABSTRACT

An arcing fault detector is set up to identify arcing faults and to distinguish them from other disturbances in a circuit. A plurality of electrical conditions are monitored and the conditions are tested against predetermined parameters for establishing a series of logical conditions relating to the presence of an arcing fault. A logic circuit combines the logical conditions for deciding on the presence of an arcing fault. An output signal of the logic circuit is used to activate a relay for interrupting the supply of electrical power to the circuit.

31 Claims, 3 Drawing Sheets

ARCING FAULT DETECTOR

BACKGROUND

Arcing faults cause many fires in homes, businesses, and industrial plants. Such faults often go undetected by conventional fault detectors that respond only to abnormally high levels of current in a circuit. For example, circuit breakers do not trip unless an amount of current above their rated value is sustained in their circuit.

In contrast to other types of faults (e.g., bolted faults) which can be detected by conventional circuit breakers, arcing faults occur periodically for only short time intervals and generally do not support very high levels of average fault current in a circuit. Nevertheless, arcing faults can produce sparks which measure 10,000 degrees centigrade or more. Thus, although arcing faults may not support readily detectable fault currents, arcing faults can produce sparks that are capable of starting many fires.

Like bolted faults, arcing faults may occur either between two wires or between a wire and ground. However, unlike bolted faults, an air gap separates the two wires or the wire and ground between which arcing fault currents must pass. Accordingly, a substantial voltage across the gap is required to overcome resistance of the gap and to permit current to pass through the gap. Current flow across arcing faults is relatively short lived because the voltage of conventional alternating current circuits (AC circuits) periodically reverses polarity and drops below a value needed to sustain current flow through the fault gap. Also, the current lags behind the voltage in phase angle and takes time to rise to a maximum value through the gap. Together, these two characteristics of arcing faults significantly limit the average amount of current that can flow through an arcing fault gap. Such low levels of average current may not be easily distinguished from other amounts of current that ordinarily flow through the circuit.

One previous attempt to detect lower levels of fault current that might be associated with arcing faults is disclosed in U.S. Pat. No. 3,911,323 to Wilson et al. A transistor amplifier is used to make the conventional detection equipment more sensitive to ground fault currents. Initially, only a warning signal is given in response to the detection of possible fault currents that are not of a sufficient magnitude to trip a circuit breaker. However, if the fault current persists and increases to a substantial level, a ground fault indicator is used to trip a circuit breaker.

Although the known fault detector may indicate the presence of arcing faults to ground, other types of arcing faults (e.g., wire-to-wire faults) go undetected. Further, the detector of Wilson et al. permits arcing faults to continue unabated for a considerable period of time. A fire may be started by the fault well before the fault current raises to the substantial level at which the circuit is interrupted.

Nevertheless, it would not be a good idea to modify the detector of Wilson et al. to interrupt the circuit in response to a possible ground fault any sooner. Other ordinary circuit disturbances can produce erroneous indications of a temporary ground fault. Moreover, it is a very serious matter to cut off the power to a circuit, and such a step should not be taken unless there is a clear presence of a fault. In a household circuit, the interruption of power shuts off the supply of heat, refrigeration, and lights; any one of which can have serious consequences. Valuable data in active computer memory can also be lost by an unexpected power loss at businesses. Further, in an industrial plant, a sudden power loss can damage equipment or parts in manufacture, and can pose a significant safety hazard.

In addition to supporting fault current, arcing faults also exhibit a variety of other electrical characteristics. However, many of the same or similar characteristics can be exhibited by other circuit disturbances that do not warrant cutting off the supply of power to the circuit. Accordingly, it has been a general practice to merely activate some form of alarm in the presence of faults that involve only small leakages of current rather than to immediately cut off the supply of power. As a result, most households, businesses, and industrial plants are not very well protected against arcing faults and are subject to electrical fires that are started before conventional fault detection equipment cuts off the supply of electrical current to the fault.

SUMMARY OF THE INVENTION

My invention overcomes the above-described problems with the prior art by providing a new fault detector that quickly identifies and distinguishes arcing faults from other circuit disturbances and interrupts the supply of electrical power to the circuit in which an arcing fault is detected. Arcing faults are identified and distinguished from other types of circuit disturbances by monitoring the circuit for a plurality of conditions that are characteristic of arcing faults and by combining the state of those conditions in a prearranged logic circuit. An output signal from the logic circuit indicating the presence of an arcing fault is used to trip a circuit breaker and interrupt power to the faulted circuit.

The logic may be preset to provide protection for a number of different circuit configurations or may be set to accommodate the special circumstances of a particular circuit. The important decision to interrupt the protected circuit is made by the logic circuit based on a plurality of monitored conditions relating to known electrical characteristics of arcing faults. The monitored conditions are logically combined to identify arcing faults and to distinguish the arcing faults from other anticipated electrical disturbances which may exhibit one or more similar electrical characteristics in the protected circuit.

Some of the monitored electrical characteristics may be exhibited by all arcing faults, but the same electrical characteristics may be exhibited by other circuit disturbances as well. These characteristics establish nonexclusive conditions. Other of the monitored characteristics may be exhibited by only arcing faults or other types of faults, but not all arcing faults may exhibit these characteristics. These other monitored characteristics establish noninclusive conditions. Yet other monitored characteristics may be generally exhibited by most arcing faults but not all, and may only rarely be exhibited by other circuit disturbances. These yet other characteristics establish nonexclusive-noninclusive conditions.

Preferably, the nonexclusive conditions are combined by a logical "and" gate in the logic circuit to further exclude disturbances that exhibit only one of the characteristics that establish the respective nonexclusive conditions. The noninclusive conditions are preferably combined by a logical "or" gate to further include arcing faults that exhibit only one of the characteristics that establish the respective noninclusive conditions. However, it is generally not preferred to combine nonexclusive and noninclusive conditions or even to further combine groups of combined nonexclusive and noninclusive conditions in the same logic circuit unless a nonexclusive-noninclusive condition is present.

The nonexclusive-noninclusive conditions may be combined with either a nonexclusive or another nonexclusive-noninclusive condition by a logical "and" for effectively establishing a single noninclusive condition. Similarly, the nonexclusive-noninclusive conditions may be combined with either a noninclusive or another nonexclusive-noninclusive condition by a logical "or" for effectively establishing a single nonexclusive condition. Thereafter, the effective conditions can be combined with a like condition or another like effective condition as explained above.

A wide variety of electrical characteristics are exhibited by at least some arcing faults. Many of these characteristics can be detected by monitoring source values of voltage and current in a circuit. For example, arcing faults exhibit very low power factors. Typically, the current lags behind the voltage by a phase angle of 85 degrees or more when an arcing fault is present. The resulting power factors (Cosine 85 degrees) are less than 0.1. Other circuit disturbances, accompanying such events as the starting of motors or fluorescent lights, may also exhibit reduced power factors. Nevertheless, power factors less than 0.1 are generally reserved to faults On the other hand, not all arcing faults exhibit power factors less than 0.1. Accordingly, the characteristic of a circuit power factor less than 0.1 may be regarded as a noninclusive condition.

Another characteristic of arcing faults relates to a voltage drop that accompanies the flow of current across an arcing fault gap. Once the instantaneous voltage across the gap reaches a spark-over value (i.e., the voltage required to induce current flow across the gap), the voltage drops off to a relatively constant level that is required to sustain the flow of current across the gap. The voltage remains relatively constant until after the voltage reverses polarity.

One condition that may be derived from this characteristic relates to comparing the usual peak voltage of the circuit to the actual circuit voltage in the timed vicinity of the usual occurrence of the peak voltage. For example, peak voltages usually occur at 90 degree phase angles from the zero crossing point of the voltage. Voltage associated with the occurrence of an arcing fault is significantly reduced in the vicinity of the 90 degree phase angle. However, it is preferred to monitor the voltage within a short interval that extends slightly beyond 90 degrees to include arcing faults having spark-over values up to the usual peak voltage at 90 degrees. The interval is kept short to limit the amount of time available for another disturbance to affect the monitored voltage. It is also preferred to select a threshold voltage value, beneath which an arcing fault is indicated, and just above the expected voltage value required to sustain a current across the arcing fault gap in the circuit.

The above-mentioned parameters of phase angle, time interval, and threshold voltage value are generally set to include most arcing faults and exclude most other disturbances. This establishes a nonexclusive-noninclusive condition. However, the same parameters may be adjusted for a particular circuit to establish either a nonexclusive or noninclusive condition. Also, the same electrical characteristic can be monitored differently to establish, for example, a more exclusive condition by either requiring the reduced voltage value to be maintained for a period of time or requiring the initially reduced voltage to be maintained above a predetermined value in the vicinity of the point at which the voltage ordinarily reverses polarity.

Another characteristic of arcing faults is the presence of a DC component of the monitored alternating current circuit. The DC component includes a very fast rise time in the event of an arcing fault and is registered in the current as a very high frequency disturbance. All arcing faults are believed to exhibit such high frequency disturbances, but such disturbances are not necessarily limited to arcing faults. Accordingly, the presence of a high frequency disturbance establishes a nonexclusive condition.

Apparatus provided by my invention for monitoring a circuit for arcing faults includes a current transformer and a voltage divider for respectively isolating the behavior of current and voltage in the circuit. Output signals from the two devices are in the form of very low voltages that vary in accordance with the current and voltages in the circuit. The output signals are processed by a plurality of circuits that isolate electrical characteristics of the monitored circuit and that include test parameters for establishing conditions that identify particular electrical characteristics as bearing respective logical relationships to the presence of an arcing fault in the monitored circuit. Analog-to-digital comparator means is used to register the established conditions as digitally processable values. A logic circuit combines the digitally registered conditions to produce an output signal indicating the presence of an arcing fault in the monitored circuit. At a minimum, the output signal of the logic circuit registers not less than the number of actual arcing faults fulfilling any one of the logical conditions and not more than the number of non-fault disturbances fulfilling any other condition. However, it is preferred to provide a combination of conditions whereby the output signal also registers less than the number of non-fault disturbances that fulfill any one condition. A relay operable in response to the output signal of the logic circuit provides for arming an alarm and for interrupting the supply of power to the monitored circuit.

My invention provides important protection for household, business, and industrial electrical circuits by more consistently identifying arcing faults within a level of confidence whereby it is appropriate to interrupt power to the protected circuit. The presence of arcing faults may also be detected before a second strike can occur, and the power is interrupted before most fires can have a chance to start.

DRAWINGS

FIGS. 3(a) through 3(d) depict a set of rules for combining logical conditions relating to the presence of arcing faults.

DETAILED DESCRIPTION

Figure 1:
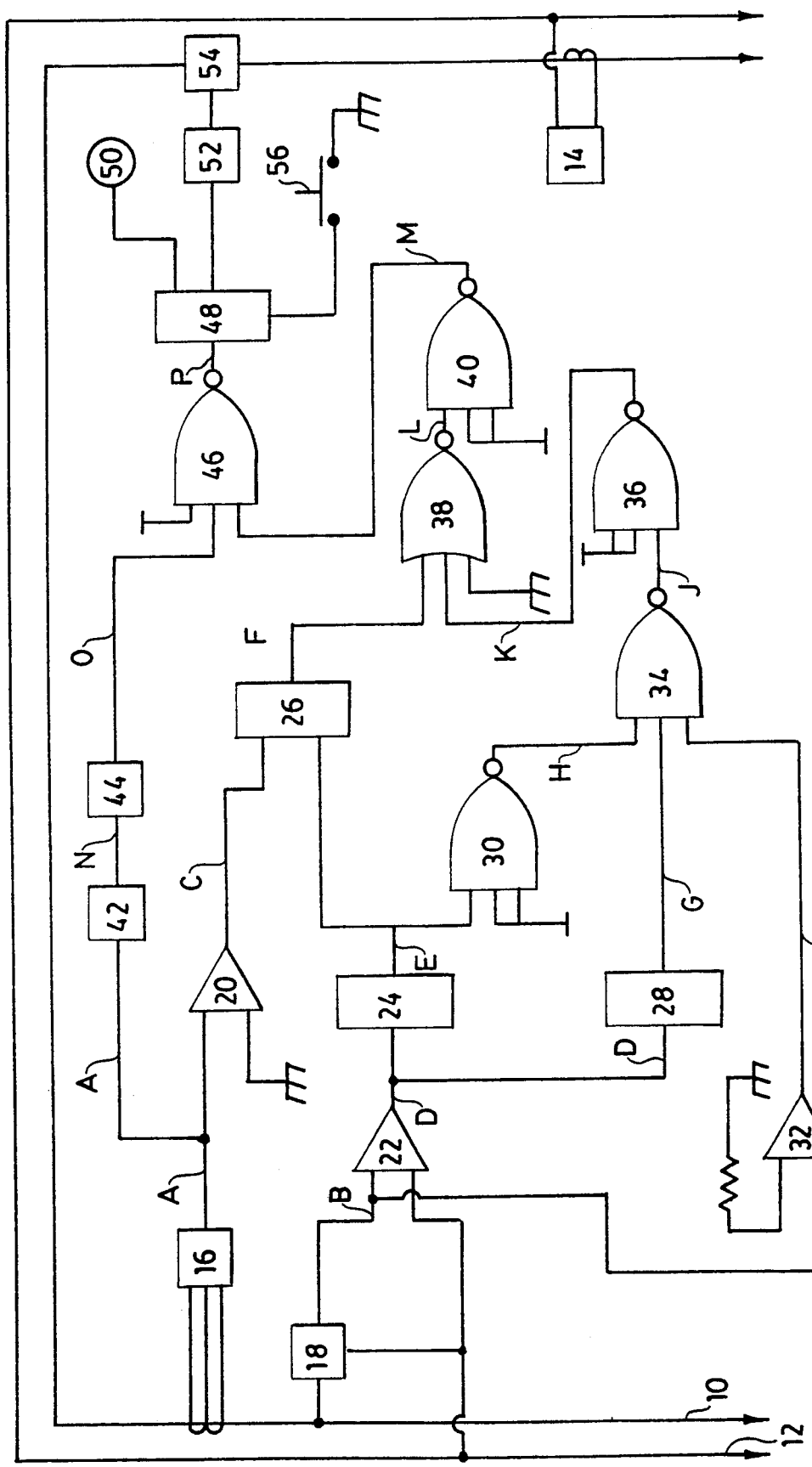
FIG. 1 is a schematic diagram of a circuit that may be used in accordance with the present invention for detecting arcing faults, arming an alarm and interrupting the supply of power to the affected circuit.

My invention is depicted in FIG. 1 monitoring a typical (e.g., 120 volt) household circuit. Power line 10 and neutral line 12 convey alternating current supplied by power source 14. Although shown as a block within my circuit diagram, power source 14 may represent a commercial power source very remote from my depicted circuit.

My detector is connected to the household circuit by current transformer 16 and voltage divider 18. Respective output signals A and B, shown also in FIG. 2, track the respective behaviors of current and voltage in the household circuit. The tracking is accomplished by small variations of voltage in the respective signals. For example, the signals may vary in voltage between zero and 5 volts.

Figure 2:
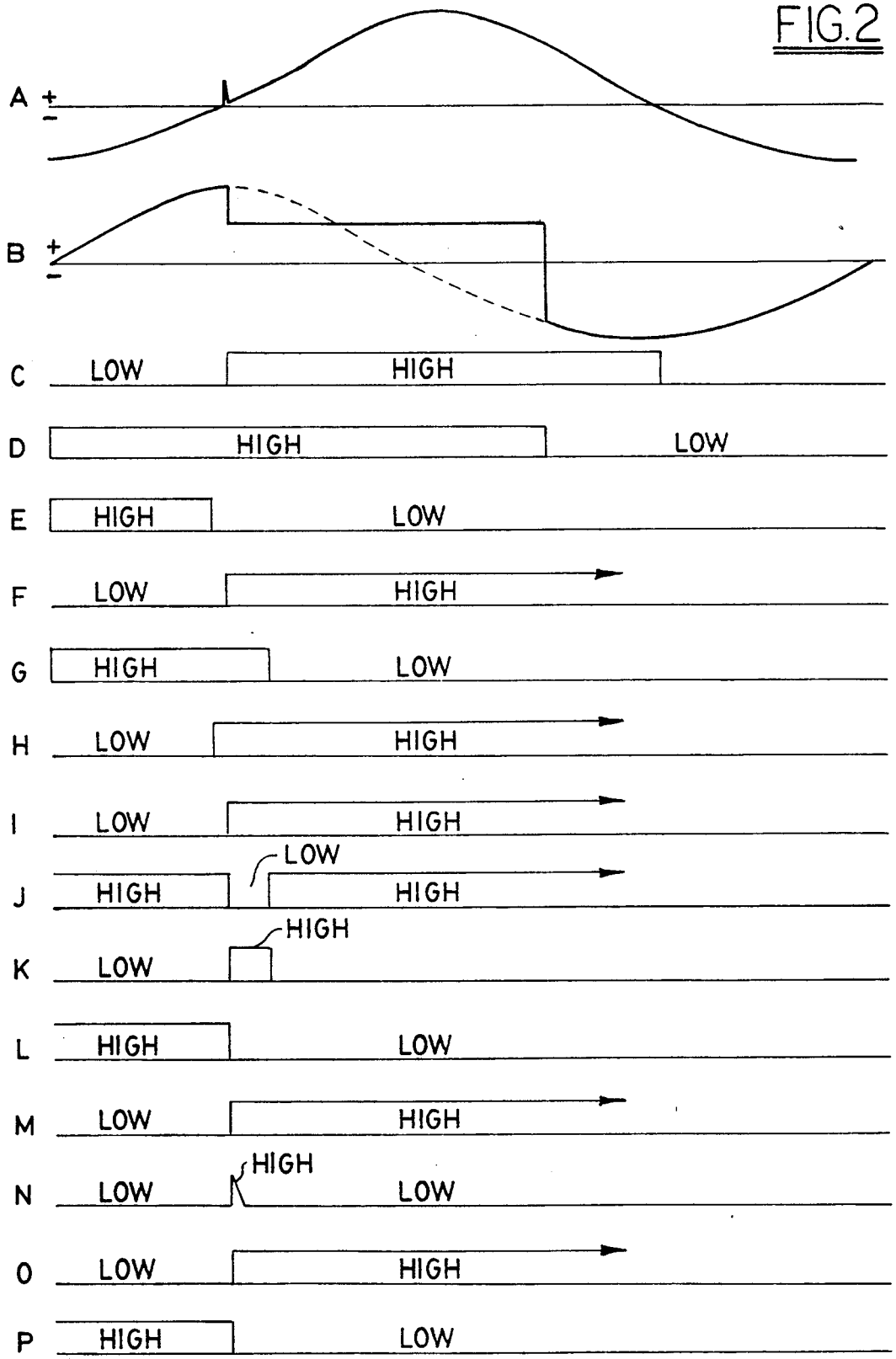
FIG. 2 is a timing chart which shows the comparative progress of different signals advancing through the circuit of FIG. 1.

Analog-to-digital comparators 20 and 22 respectively compare the signals A and B to a zero, ground, or neutral reference voltage and output high logic condition signals when the signals A or B exceed the zero reference voltage. For example, as shown in FIG. 2, both output signal C from comparator 20 and output signal D from comparator 22 assume a high logic condition when respective tracking signals A and B exhibit positive voltages.

The leading edge of a high logic signal D starts timer 24. Output signal E from the timer is programmed to remain high until a predetermined time interval has elapsed since the timer was started. The predetermined time interval is set to correspond to a minimum phase angle between the leading edge of voltage signal D and the leading edge of current signal C beyond which a low power factor of an arcing fault is indicated.

The signals C and E are connected to a conventional flip-flop arrangement 26. The leading edge of current signal C entering the flip-flop arrangement enables flip-flop output signal F to track the inverse of timer signal E. For example, flip-flop signal F assumes a high logic condition when the leading edge of current signal C enters the flip-flop arrangement after the interval timed by timer 24 has elapsed. Accordingly, a high logic condition of flip-flop signal F indicates that the power factor of the monitored circuit is less than a predetermined amount controlled by the interval timed by timer 24. Preferably, the timed interval is set so that the signal F indicates power factors less than or equal to 0.1 and thereby excludes all non-fault disturbances. However, since it is possible for certain arcing faults to exhibit power factors greater than 0.1, the signal F may be understood to register a noninclusive condition of an arcing fault.

The leading edge of voltage signal D is also used to start timer 28. Output signal G of timer 28 is programmed to remain in a high logic condition until a timed interval, extending slightly beyond a 90° phase angle of voltage signal B, has elapsed. The output E from the other timer is inverted by "nand" gate 30 to a signal H that reflects a high logic condition when the time limit of timer 24 has been exceeded. Accordingly, a high logic condition of both timer signals G and H indicates a period of time during which the interval timed by timer 28 exceeds the timed interval of timer 24. This period is set to include the 90 degree phase angle of voltage signal B at which the usual peak voltage of the signal occurs.

The output signal B from voltage divider 18 is also connected to another analog-to-digital comparator 32. However, instead of comparing the signal B to a zero reference voltage, the comparator 32 compares the signal B to a predetermined maximum reference voltage and outputs a high logic signal I in response to signal voltages that are less than the predetermined reference voltage. The logic conditions G, H, and I are combined at "nand" gate 34 to ascertain the presence of another electrical characteristic of the monitored circuit which bears a logical relationship to the presence of an arcing fault. Signal J from the output lead of the "nand" gate 34 assumes a low logic condition only when all of the input signals G, H, and I are high. This means that the signal J is low only when a predetermined voltage drop has occurred in the vicinity of the usual peak values of the voltage signal.

The reference voltage of comparator 32 is set lower than most disturbances that may occur in the vicinity of the peak voltage and higher than most voltages required to sustain arcing faults in the monitored circuit. Accordingly, the signal J registers a nonexclusive-noninclusive condition of an arcing fault. Thereafter, the signal J is inverted by "nand" gate 36 into a signal K that registers the same result as a high logic condition.

The low power factor signal F is combined with voltage drop signal K at "nor" gate 38. Output signal L of "nor" gate 38 is low whenever either signal F or K is high. The signal L is M is then inverted by nand gate 40 to a signal M so that the logical state of signal M reflects the combination of the noninclusive condition of signal F and the nonexclusive-noninclusive condition of signal K by a logical "or". As a result, the signal M registers an effective nonexclusive condition, the high state of which is more inclusive of actual arcing faults than either signal F or K and is no less exclusive of other disturbances than logic signal K alone.

Signal A, which tracks the behavior of current in the monitored circuit, is also connected to high pass filter 42. The filter is of a conventional type which permits only high frequency current in the range of frequencies exhibited by arcing faults to pass through the filter (e.g., 5000 hertz). Output signal N from the filter takes the form of a momentary burst of current in the presence of a high frequency disturbance in the monitored circuit. Amplitude demodulator 44 receives the signal N and outputs a logical condition signal O that retains a high value for a longer duration of time than signal N. The duration of signal N is extended by signal O to enable any output of filter 42 to arrive contemporaneously at "nand" gate 46 with the signal M. The high frequency threshold of filter 42 is selected so that logic signal O exhibits a high condition in the presence of any arcing fault. However, it is possible for other disturbances to also impact the current with similar high frequencies. Accordingly, the logic condition O is regarded as registering a nonexclusive condition of an arcing fault.

The "nand" gate 46 combines the nonexclusive logic condition O with the effective nonexclusive condition M and outputs a signal P that assumes a low state only if both logic conditions 0 and M exhibit high states. Although the output of signal P is the inverse of the combination of the same two condition signals by a logical "and", the state of signal P reflects the same information that would be available from its inverse representation. Accordingly, the combination of the conditions O and M by the equivalent of a logical "and" results in a low logic condition of output signal P that is more exclusive of other disturbances than either condition O or M. Furthermore, since the condition M is nonexclusive, the low condition of signal P is also more inclusive than either condition F or K. Together, this two stage logical combination of three condition signals (F, K, and O) provides greater assurance that actual arcing faults will be detected and other disturbances will not be mistakenly detected as arcing faults.

The signal P enters latching circuit 48 that is switched to an activating condition by any occurrence of a low condition of signal P until reset by switch 56. Latching circuit 48 activates both alarm diode 50 and relay 52. Circuit breaker 54 is tripped by relay 52 whenever the latching circuit is switched to an activating condition. In other words, the low logic condition of signal P provides for interrupting the supply of power to the household circuit in the clear presence of an arcing fault.

Although my invention has been described with only particular electrical characteristics of the circuit being monitored and with particular parameters establishing logical conditions for deciding on the presence of an arcing fault, it would be possible to monitor the circuit for other characteristic behaviors of arcing faults and to use other parameters for establishing other combinations of logical conditions to identify and distinguish arcing faults. Furthermore, although the depicted circuit includes a particular combination of well-known electrical components, it may be appreciated that all of the digital functions of my circuit may be accomplished by equivalent means within a programmable controller. Such a controller could also be used to more readily amend the logic of the circuit to accommodate the requirements of a different circuit. Alternatively, the conditions F, K, and 0 could be input to a conventional decoder which would enable the selection of other logical combinations between the conditions by activating switches.

Figure 3A:
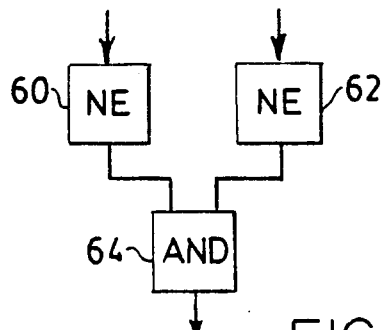
Figure 3B:
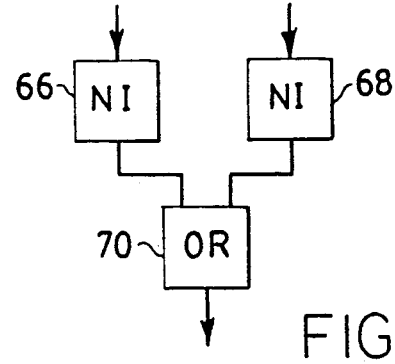
Figure 3C:
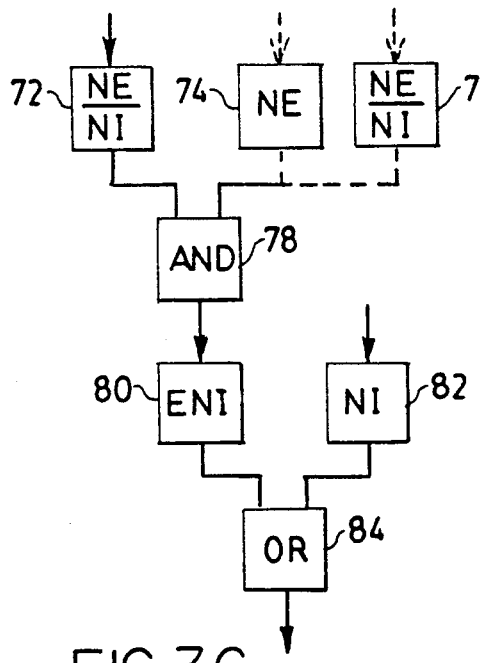
Figure 3D:
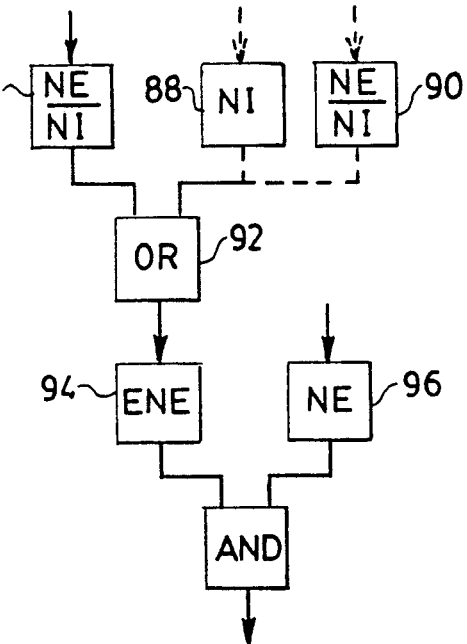

FIGS. 3(a) through 3(d) depict basic rules for combining the logical conditions in respective block diagrams. For example, FIG. 3(a) shows two nonexclusive conditions 60 and 62 combined by a logical "and" block 64, whereas FIG. 3(b) shows two noninclusive conditions 66 and 68 combined by a logical "or" block 70. In FIG. 3(c), a nonexclusive-noninclusive condition 72 is combined with one of a nonexclusive condition 74 and another nonexclusive-noninclusive condition 76 by a logical "and" block 78 establishing an effective noninclusive condition 80. Thereafter, a noninclusive condition 82 is combined with the effective noninclusive condition 80 by a logical "or" block 84, according to the rule depicted in FIG. 3(b). In FIG. 3(d), a nonexclusive-noninclusive condition 86 is combined with one of a noninclusive condition 88 and another nonexclusive-noninclusive condition 90 by a logical "or" block 92 establishing an effective nonexclusive condition 94. Thereafter, a nonexclusive condition 96 is combined with the effective nonexclusive condition 94 by a logical "and" block 98, according to the rule depicted in FIG. 3(a).

In a more general sense, it may be appreciated that although the depicted circuit is connected to an ordinary 120 volt system, it would also be possible to connect my device to any standard system (e.g., 120/240, 120/208, 277/480, 2400/4160, and 7200/12,500, etc.). Line-to-line protection requires additional current transformers and voltage dividers for monitoring the additional lines, but the same detection circuitry can be used to identify and distinguish arcing faults between the lines. For example, two wire single-phase circuits require one detection circuit, three wire single-phase circuits require two detection circuits, and three wire and four wire three-phase circuits require three detection circuits.

I claim:

1. An arcing fault detector for protecting household, business, and industrial electrical circuits comprising:
   a current transformer that produces a signal for tracking the behavior of current in the electrical circuit;
   a voltage divider that produces a signal for tracking the behavior of voltage in the electrical circuit;
   a plurality of processing circuits that isolates individual electrical characteristics apparent from the current and voltage tracking signals and that tests the individual electrical characteristics against predetermined parameters bearing respective logical relationships to the presence of an arcing fault in the electrical circuit;
   comparators within each of said processing circuits that register the outcome of the tested electrical characteristics as logical condition signals;
   a logic circuit that combines the logical condition signals and that produces an output signal which registers not less than all actual arcing faults that fulfill any one of the logical conditions and not more than all non-fault disturbances that fulfill any one other of the logical conditions; and
   means for interrupting electrical power to the electrical circuit in response to a logical state of the output signal.

2. The arcing fault detector of claim 1 wherein the test parameters define each of the respective logical relationships as one of a nonexclusive condition, a noninclusive condition, and a nonexclusive-noninclusive condition.

3. The arcing fault detector of claim 2 wherein said logic circuit combines two nonexclusive conditions with a logical "and".

4. The arcing fault detector of claim 3 wherein the output signal of the logic circuit registers less than all non-fault disturbances that fulfill any one of the nonexclusive conditions.

5. The arcing fault detector of claim 2 wherein said logic circuit combines two noninclusive conditions with a logical "or".

6. The arcing fault detector of claim 5 wherein the output signal of the logic circuit register-s-more than all actual arcing faults that fulfill any one of the noninclusive conditions.

7. The arcing fault detector of claim 2 wherein said logic circuit combines a nonexclusive-noninclusive condition and one of a nonexclusive condition and another nonexclusive-noninclusive condition with a logical "and" for defining an effective noninclusive condition.

8. The arcing fault detector of claim 7 wherein said logic circuit also combines said effective noninclusive condition and a noninclusive condition with a logical "or".

9. The arcing fault detector of claim 8 wherein the output signal of the logic circuit registers more than all actual arcing faults that fulfill any one of the noninclusive and nonexclusive-noninclusive conditions.

10. The arcing fault detector of claim 2 wherein said logic circuit combines a nonexclusive-noninclusive condition and one of a noninclusive condition and another nonexclusive-noninclusive condition with a logical "or" for defining an effective nonexclusive condition.

11. The arcing fault detector of claim 10 wherein said logic circuit also combines said effective nonexclusive condition and a nonexclusive condition with a logical "and".

12. The arcing fault detector of claim 11 wherein the output signal of the logic circuit registers less than all non-fault disturbances that fulfill any one of the nonexclusive and nonexclusive-noninclusive conditions.

13. The arcing fault detector of claim 1 wherein one of said plurality of processing circuits provides for testing for a reduced power factor in the range of power factors associated with arcing faults.

14. The arcing fault detector of claim 13 wherein one of said comparators registers the outcome of the test for a reduced power factor as a noninclusive condition.

15. The arcing fault detector of claim 1 wherein one of said plurality of processing circuits provides for testing for a reduced voltage in the timed vicinity of the usual occurrence of a peak voltage.

16. The arcing fault detector of claim 15 wherein one of said comparators registers the outcome of the test for a reduced voltage as a noninclusive-noninclusive condition.

17. The arcing fault detector of claim 1 wherein one of said plurality of processing circuits provides for testing for a high frequency current disturbance of the type produced by a DC current component of an arcing fault current.

18. The arcing fault detector of claim 17 wherein one of said comparators registers the outcome of the test for a high frequency current disturbance as a nonexclusive condition.

19. An arcing fault detector for an electrical circuit comprising:
a current transformer for producing a signal tracking the behavior of current in the electrical circuit;
a voltage divider for producing a signal tracking the behavior of voltage in the electrical circuit;
a first timer for comparing a phase relationship between the voltage tracking signal and current tracking signal;
second timer for identifying a timed interval in the vicinity of the usual peak voltage of the voltage tracking signal;
a comparator for identifying a reduced voltage within the timed interval with respect to the usual peak voltage;
a high pass filter for identifying the an occurrence of a high frequency disturbance in the current tracking signal; and
a logic circuit for combining conditions relating to (a) the phase relationship between the voltage tracking signal and current tracking signal, (b) the voltage within the timed interval, and (c) the frequency of disturbance in the current tracking signal, and for producing an output signal indicating the presence of an arcing fault in the electrical circuit.

20. The arcing fault detector of claim 19 further comprising a relay for interrupting a supply of power to the electrical circuit.

21. The arcing fault detector of claim 19 wherein the phase relationship is used to identify low power factors associated with arcing faults.

22. The arcing fault detector of claim 19 wherein the voltage within the timed interval is used to identify reduced voltages required to sustain current flow across an arcing fault gap.

23. The arcing fault detector of claim 19 wherein the frequency disturbance in the current tracking signal is used to identify DC current components associated with arcing faults.

24. An arcing fault detector for interrupting the supply of electrical power to a circuit comprising:
means for producing a signal tracking the behavior of current in the circuit;
means for producing a signal tracking the behavior of voltage in the circuit;
means for processing at least one of the signals tracking the respective behaviors of current and voltage in the circuit, and for identifying a first electrical characteristic bearing a logical relationship to the presence of an arcing fault in the circuit as one of a nonexclusive condition, a noninclusive condition, and a nonexclusive-noninclusive condition;
means for processing at least the other of the signals tracking the respective behaviors of current and voltage in the circuit, and for identifying a second electrical characteristic bearing a logical relationship to the presence of an arcing fault in the circuit as one of a nonexclusive condition, a noninclusive condition, and a nonexclusive-noninclusive condition;
means for producing a logical output signal by logically combining the one of the logical conditions relating to the first electrical characteristic with the one of the logical conditions relating to the second electrical characteristic according to one of the following rules wherein:
two nonexclusive conditions are combined with a logical "and",
two noninclusive conditions are combined with a logical "or",
a nonexclusive-noninclusive condition and one of a nonexclusive condition and another nonexclusive-noninclusive condition are combined by a logical "and" defining an effective noninclusive condition, and
a nonexclusive-noninclusive condition and one of a noninclusive condition and another nonexclusive-noninclusive condition are combined by a logical "or" defining an effective nonexclusive condition; and
means for interrupting the supply of electrical power to the circuit in response to a logical state of the output signal.

25. The arcing fault detector of claim 24 wherein said logical output means combines two nonexclusive conditions with a logical "and".

26. The arcing fault detector of claim 24 wherein said logical output means combines two noninclusive conditions with a logical "or".

27. The arcing fault detector of claim 24 including further means for processing both of the signals tracking the respective behaviors of current and voltage in the circuit, and for identifying a third electrical characteristic bearing a logical relationship to the presence of an arcing fault in the circuit as one of a nonexclusive condition, a noninclusive condition, and a nonexclusive-noninclusive condition.

28. The arcing fault detector of claim 27 wherein said logical output means combines a nonexclusive-noninclusive condition and one of a nonexclusive condition and another nonexclusive-noninclusive condition with a logical "and" for defining an effective noninclusive condition.

29. The arcing fault detector of claim 28 wherein said logical output means also combines said effective noninclusive condition and a noninclusive condition with a logical "or".

30. The arcing fault detector of claim 27 wherein said logical output means combines a nonexclusive-noninclusive condition and one of a noninclusive condition and another nonexclusive-noninclusive condition with a logical "or" for defining an effective nonexclusive condition.

31. The arcing fault detector of claim 29 wherein said logical output means also combines said effective nonexclusive condition and a nonexclusive condition with a logical "and".

* * * * *